United States Patent [19]

Dahlberg

[11] 4,249,121

[45] Feb. 3, 1981

[54] THERMOELECTRIC ARRANGEMENT

[76] Inventor: Reinhard Dahlberg, Innere Bergstrabe 32, D-7101 Flein, Fed. Rep. of Germany

[21] Appl. No.: 928,258

[22] Filed: Jul. 26, 1978

[30] Foreign Application Priority Data

Jul. 28, 1977 [DE] Fed. Rep. of Germany ....... 2734022

[51] Int. Cl.$^2$ ............................................ H01J 45/00
[52] U.S. Cl. .................................... 322/2 R; 310/306
[58] Field of Search .................. 310/306, 307; 322/2; 73/341, 351

[56] References Cited

U.S. PATENT DOCUMENTS

| | | | |
|---|---|---|---|
| 3,714,539 | 1/1973 | Hampl | 322/2 R |
| 3,757,146 | 9/1973 | Love | 310/306 |

Primary Examiner—Robert J. Hickey
Attorney, Agent, or Firm—Spencer & Kaye

[57] ABSTRACT

A thermoelectric arrangement comprises a thermoelement built up of element limbs of strips, discs or rings formed from plates foils or layers, means for moving the strips discs or rings relative to each other and in touch contact at least at one print to form a bundle of alternate p/n and n/p thermoelectrical junctions and means, for enabling an electrical current to flow through the bundle perpendicular to the surface of the strips, discs or rings.

16 Claims, 11 Drawing Figures

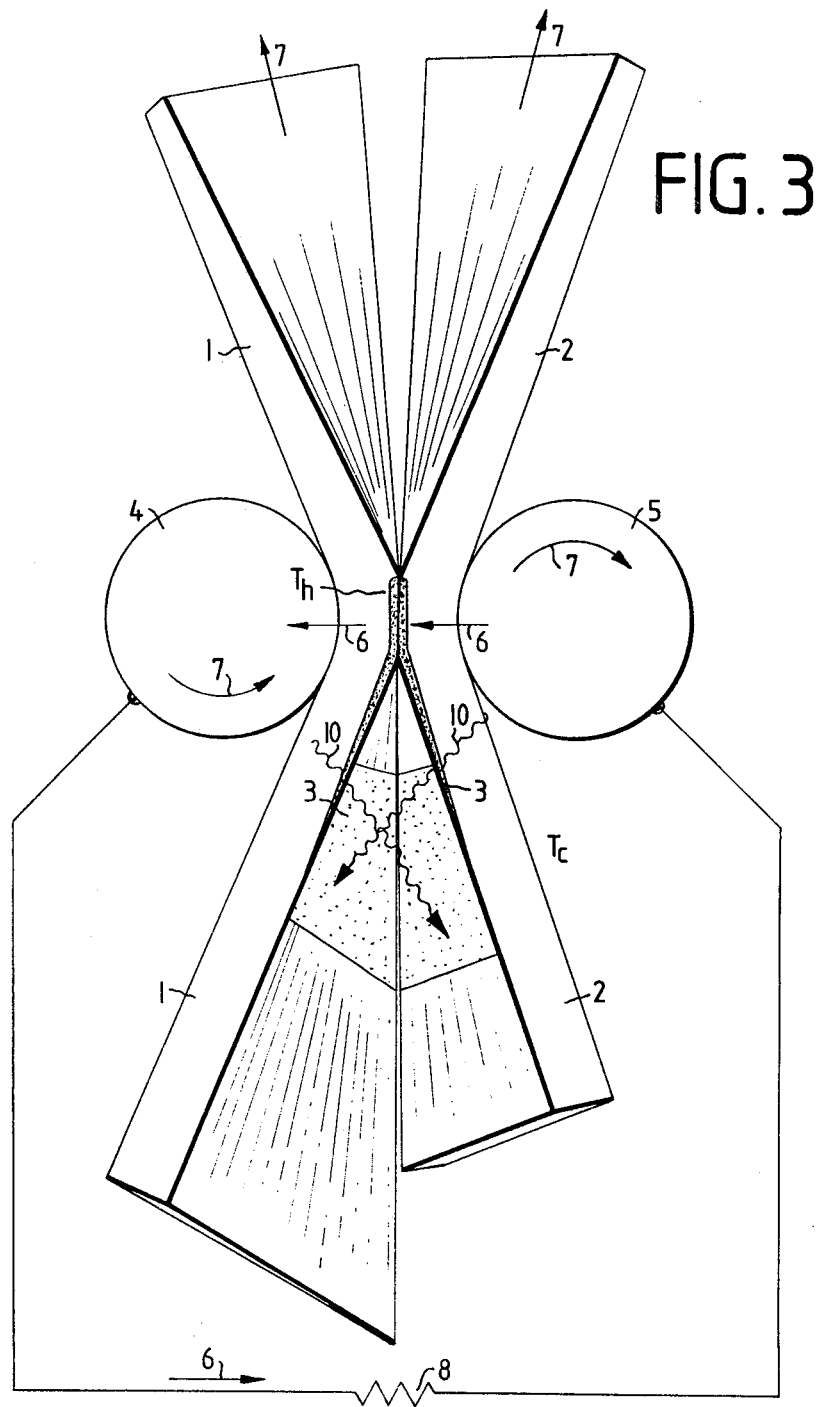

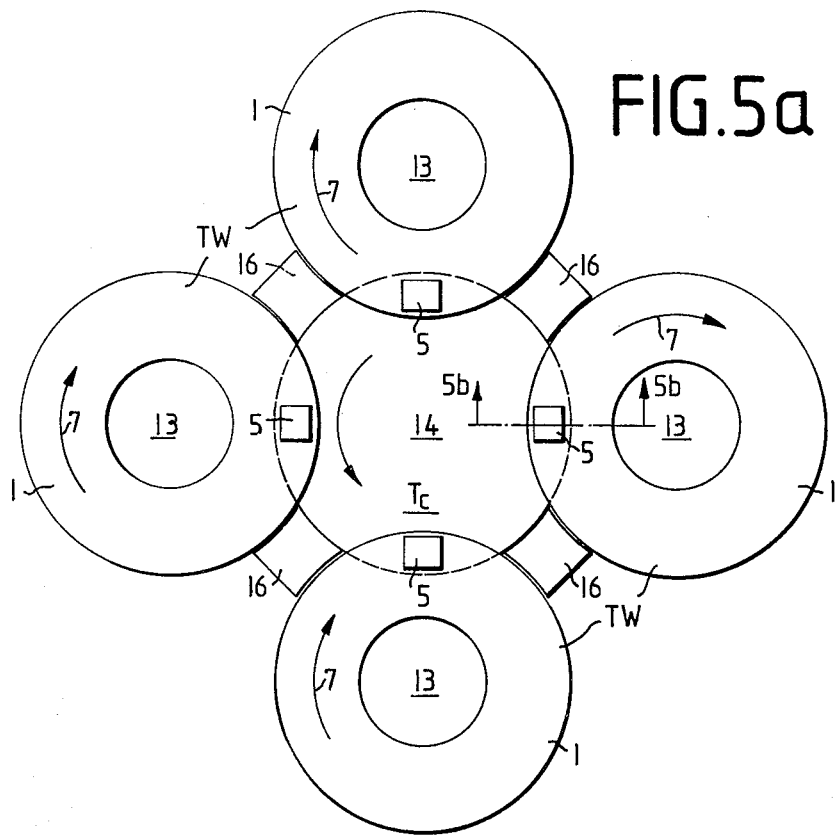
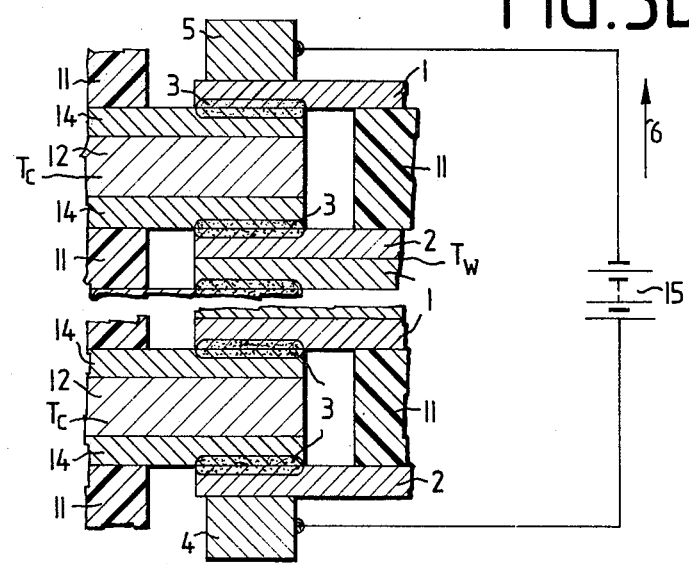

THERMOELECTRIC ARRANGEMENT

BACKGROUND OF THE INVENTION

The invention relates to a thermoelectric arrangement for converting heat into electrical energy and for reversibly pumping heat.

Because of the relatively small thermal forces, the operating voltage and the specific electrical output of thermoelectric arrangements is generally only small. Series connection of thermoelements increases the operating voltage but, to the same extent, also increases the space requirement and the series resistance of the thermoelectric arrangements. With conventional thermoelectric arrangements, only electrical outputs of up to approxiamtely 1 watt/cm$^3$ is achieved, Moreover, the degree of efficiency of the thermoelectric conversion of energy is usually far below 10%.

In German patent application No. P 25 47 262.2, corresponding to my United States patent application Ser. No. 715,172 filed Aug. 17th, 1976, a thermoelectric arrangement is described in which the heat flow through the limbs of a thermoelement flows across large temperature gradients so tht the specific heat conductivity in the regions having the large temperature gradients is reduced. As a result, an increase in efficiency is achieved and as a result, an improvement in the thermoelectric efficiency occurs. A disadvantage of the thermoelectric arrangements in accordance with P2547162.2 is its relatively small operating voltage however.

SUMMARY OF THE INVENTION

It is an object of the present invention to provide thermoelectric arrangements with large non-stationary temperature gradients which have high specific electrical power at substantially higher operating voltages.

According to the invention, there is provided a thermoelectric arrangement comprising thermoelement, strips discs or rings formed from plates foils or layers forming element limbs, movement means for moving said strips discs or rings relative to each other with said strips, disc or rings being in touch contact at at least one point to form a bundle of alternate p/n and n/p thermoelectrical junctions and means enabling flow of electrical current through said bundle perpendicular to the main surfaces of said strips discs or rings.

BRIEF DESCRIPTION OF THE DRAWINGS

The invention will now be described in greater detail, by way of example, with reference to the drawings, in which:

FIG. 3 shows a thermoelectric arrangement in accordance with the invention having a thermoelement in the non- stationary bundle as a generator with unilateral non- stationary heating of strips;

FIGS. 5a and 5b show a thermoelectric arrangement in accordance with the invention as a pump;

DESCRIPTION OF THE PREFERRED EMBODIMENTS

Figure 1:
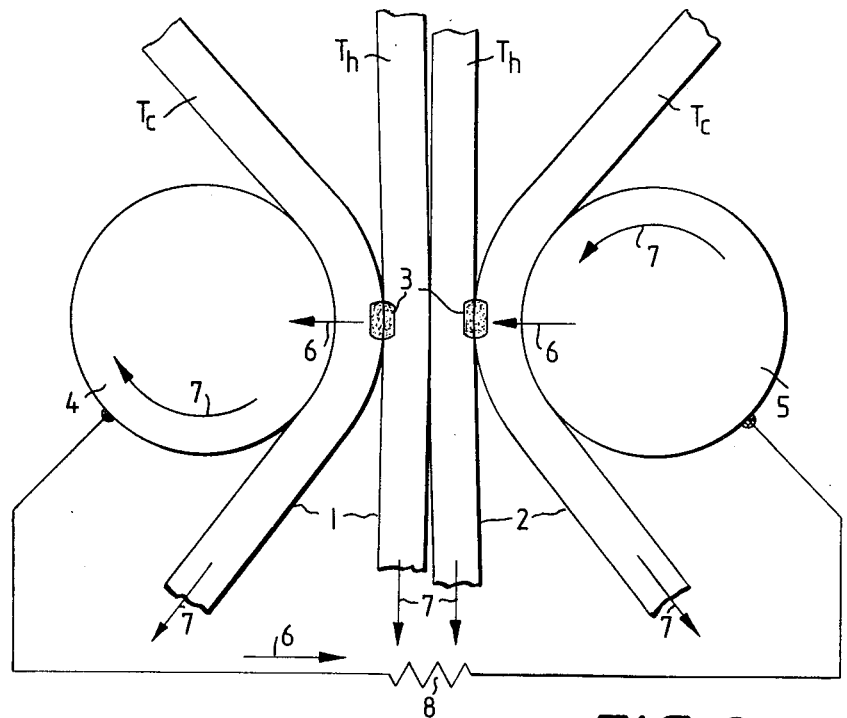
FIG. 1 shows a thermoelectric arrangement in accordance with the invention having a thermoelement in the non- stationary bundle as a generator.

In accordance with a preferred embodiment of the invention, the limbs of an element of a thermoelement are formed from plates, foils or layers, the latter having the shape of strips, plates discs or rings and being moved mechanically so that they all touch mechanically at least at one point with their surfaces and at this point form a non-stationary bundle which alternately contains thermoelectric p/n and thermoelectric n/p junctions, a temperature difference existing between these; and that an electrical current flows through the non-stationary bundle perpendicularly to the surface of the plates, foils or layers.

In the non-stationary bundle currently new hot and cold regions come into mechanical and electrical contact with each other. Temporarily, regions having large temperature gradients are formed at these touch contacts. A fairly large heat transfer as is possible for example as a result of pure heat conduction, takes place via the mechanical touching of the hot and cold strips, discs and rings moving through the non-stationary bundle. In addition, the thickness of the plates, foils or layers (from which the strips, discs or rings are formed) can be made relatively small so that the number of thermoelements connected in series electrically in the non-stationary packet bundle per centimeter can be relatively large. Finally, the electrical contact resistance between the plates, foils or layers in the non-stationary bundle can be made relatively small by means of a sufficiently large mechanical contact pressure and by means of electrical parallel connection of several non-stationary bundles. As a result of all of these factors, specific electrical voltages and powers can be derived from the thermoelectric arrangement and these are larger than in conventional thermoelectric generators by some orders of magnitude.

The temperature differences between adjacent n/p and p/n junctions in the non-stationary bundle can be produced, for example, by heating up thermoelectrically p- and n-conductive plates, foils or layers only for a very short time on one side with the aid of plasma or with the aid of radiation and by forming the non-stationary bundle immediately after reaching the highest surface temperature by pressing the respective hot or cold sides of the plates, foils or layers together.

In accordance with another embodiment, pairs of thermoelectrically p- and n-conductive plates, foils or layers, which are located in pairs at different temperatures, are brought together at one point to form a non-stationary bundle.

Since the electrical current perpendicular to the surface of the plates, foils or layers flows through the non-stationary bundle then, as a result of a magnetic field which is applied perpendicularly to the direction of the electrical current and perpendicularly to the direction of movement of the layers, a mechanical force can be produced which moves the plates, foils or layers through the non-stationary bundle or aids this movement. The magnetic field can be produced by means of a permanent magnet. However it can also be produced by means of an electromagnet which is energized by the electrical current flowing through the non-stationary bundle. The electromagnet can also be operated in "shunt motor" connection instead of this "series motor" connection, while only a part of the current is branched off for the purpose of energising the electromagnet. The motor action of this arrangement (in relation to the friction) is at an optimum if the thickness of the plates, foils or layers is so large that the sum of the electrical bulk resistances perpendicularly through the plates, foils or layers in the non-stationary bundle is approximately just as large as the sum of all of the contact resistances.

The thermoelectric arrangements in accordance with the invention can be used advantageously for the purpose of converting heat into electrical energy. Because of their large power density, they are just as suitable as generators for vehicles as they are for power stations of different sizes.

However they can also be used as heat pumps for cooling and reversible heating by supplying electrical power by means of the Peltier effect. The electrical current through the non-stationary bundle produces heat absorption, i.e. cooling off, at the junction n→p (i.e. at the electron flow p→n).

In the operation of the thermoelectric arrangement as a generator and heat pump there is generally the desire to limit the mechanical friction between the plates, foils or layers inside the non-stationary bundle to an unavoidable minimum amount. However, the thermoelectric arrangement of the invention can also be used to convert mechanical energy (for example water power, power into frictional heat in the non-stationary bundle which is in turn converted into electrical energy. Temperatures greater than 1000° C. can be produced in the non-stationary bundle by means of friction. As a result of this, mechanical energy can be converted into removable electrical energy on a path via the friction heat at degrees of efficiency of greater than 50%.

Since the limbs of the element of the thermoelectric arrangement are formed by plates, foils or layers which have the shape of moved strips, discs or rings, the material thereof must have mechanical strength and ductility besides good electrical conductivity. In this respect metals and alloys have the best properties.

However, metal strips, metal discs or metal rings can by used successfully as element limbs and are coated on one side or on both sides with layers made from material which is thermoelectrically p- or n-conductive, said material not being sufficiently ductile in itself.

In order to reduce the mechanical friction and, above all, in order to reduce the unavoidable mechanical wear on the plates, foils or layers moving through the non-stationary bundle, the surfaces sliding on each other can be coated with a thin film of interfacial lubricant. As a result, materials having a so-called "stratified lattice structure" are especially suitable for this, such as graphite, $MoS_2$, TiTe among others and also layers made from so-called "bearing metals" such as lead, tin, indium, bismuth etc.

Since the zones having the large temperature gradients extend only up to very small distances, it is possible to permit the temperature differences to fall away within the thickness of an interfacial film of lubricant. Two different interfacial lubricants can be used for two adjacent double surfaces sliding on each other respectively, these lubricants having a high thermal force with respect to each other, such as $Pr_2O_3$ to $WSe_2$, $La_2O_3$ to $WS_2$ etc. In order that these lubricant films are not destroyed by friction, they are supplied continuously to the sliding surfaces in very small quantities. Since formation of the electrical contact between the plates, foils or layers which slide on each other in the non-stationary bundle is basically a static process, it may be useful to connect an electrical capacitor in parallel to the non-stationary bundle. As a result static fluctuations in the voltage and in the current can be smoothed out.

Several embodiments will now be described with reference to the drawings:

EMBODIMENT 1

Thermoelectrically p-conductive plates 1 made of chrome nickel (87.5% Ni+12.5% Cr) shown in FIG. 1 together with thermoelectrically n-conductive plates 2 made from thermoconstantan (60% Cu+40% Ni). All of the plates have the form of strips with a thickness of 0.5 mm and a width of 5 cm which plates are moved at a speed of 10 cm/sec as indicated by the arrows 7. The two outer strips 1 and 2 have the temperature $T_c=300°$ K., the two inner strips are located at a temperature $T_h=1100°$ K. Between two electrical contacts 4 and 5 in the form of solid rotating cylinders (rotating at the peripheral speed indicated at 7), the cold and hot strips 1 and 2 are pressed together to form a non-stationary bundle. As a result, the zones 3 with the large non-stationary temperature gradients are formed between the cold and the hot strip 1 and the cold and hot strip 2. The two strips 1 form the p-limb and the two strips 2 form the n-limb of a thermoelement, which has the formation of the non-stationary bundle 1/1/2/2. The electrical current 6 flows between the electrical contacts 5 and 4 through the non-stationary bundle to the load 8.

EMBODIMENT 2

Figure 2:
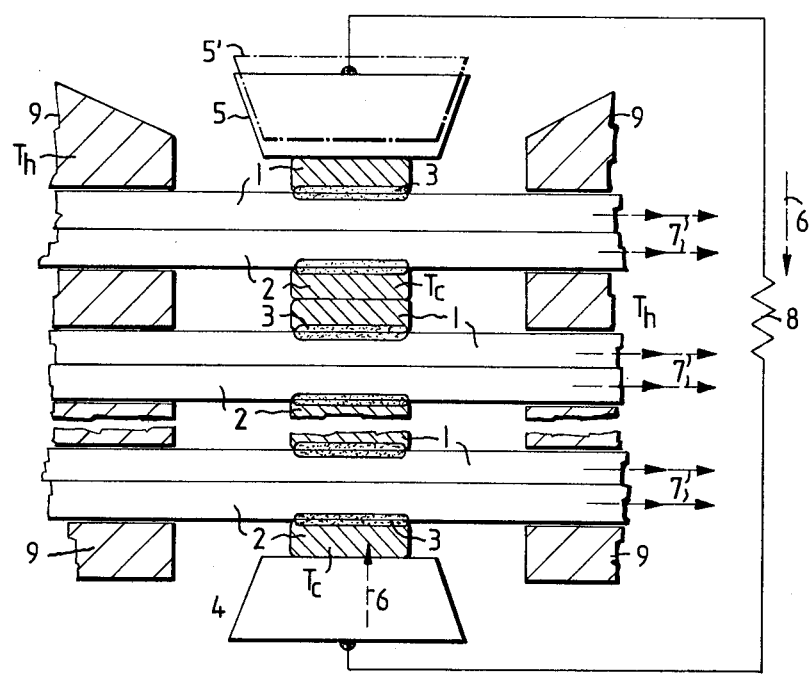
FIG. 2 shows a thermoelectric arrangement in accordance with the invention with a series circuit of several thermoelements in the non-stationary bundle as a generator having pulse-shaped emission of electrical power.

Iron strips 1 and nickel strips 2 having a width of 3 cm and a thickness of 0.1 mm are shown in FIG. 2. These strips 1 and 2 are placed together to from pairs located at different temperatures. The pairs 1 and 2 which are located at the temperature $T_h=1300°$ K. are moved as indicated by the arrows 7, in simultaneous steps of 4 cm respectively from the left-hand furnace 9 into the right-hand furnace 9. The pairs 1 and 2 which are at the temperature $T_c=300°$ K. are moved in equal phase also in simultaneous steps (also indicated by arrows 7) of 4 cm respectively perpendicular to the drawing plane. They are arranged between the pairs at the temperature $T_h=1300°$ K. The cold and warm pairs 1 and 2 are pressed together with the aid of the electrical contacts 4 and 5 which are constructed as press dies with a weight of 10 tonnes for 0.1 second in each rest phase between the simultaneous steps. This occurs twice per second. On each pressing together 1 the zones 3 with large non-stationary temperature gradients arise between the cold and warm iron strips 1 and the cold and warm nickel strips 2. The electrical current 6 flows in each case only for 0.1 seconds at spacings of 0.4 seconds through the non-stationary bundle made from the strips 1 and 2, which are pressed over each other between the electrical contacts 4 and 5, to the load 8. 5' indicates the opened electrical contact 5 during the movement phase. The entire thermoelectric arrangement is located in a nitrogen atmosphere in order to avoid corrosion. The thickness of the non-stationary bundle which is pressed together between the contacts 4 and 5 is 1 meter. A total of 2500 thermoelements having a temperature difference of $T_h - T_c = 1000°$ is located therein and these thermoelements are connected electrically in series. Because of the high contact pressure the sum of the electrical contact resistances in non-stationary bundle amounts to only $2.10^{-3}$ ohms. With a matched load 8, a maximum pulse current 6 of approximately 20 kA flows and the thermoelectric arrangement emits an electrical output of approximately 100 kilowatts over an average time.

EMBODIMENT 3

A strip of chrome nickel (87.5% Ni+12.5% Cr) having a thickness of 0.5 mm is shown at FIG. 3. 2 is a nickel strip having a thickness of 1 mm. Both strips 1 and 2 have a width of 1 meter. They are moved, as indicated at 7, of 5 meters per second. In the folded condition they are subject to focused radiation 10 from the sun of such a high intensity that on one side and in non-stationary manner they take on a surface temperature $T_h = 1400°$ K. Immediately thereafter they are drawn through between the two rollers 4 and 5 (folded over with their hot surfaces together). At the same time the rollers 4 and 5 are the electrical contacts of the thermoelement which is formed by the non-stationary bundle made from strips 1 and 2 which are heated on one side. The zones 3 having the large temperature gradients are formed between the surfaces which are heated on one side to the temperature $T_h$ and the mass of the strips 1 and 2 which are at the temperature $T_c = 400°$ K. The electrical current 6 flows through the non-stationary bundle between the electrical contacts 4 and 5 to the load 8.

EMBODIMENT 4

Figure 4A:
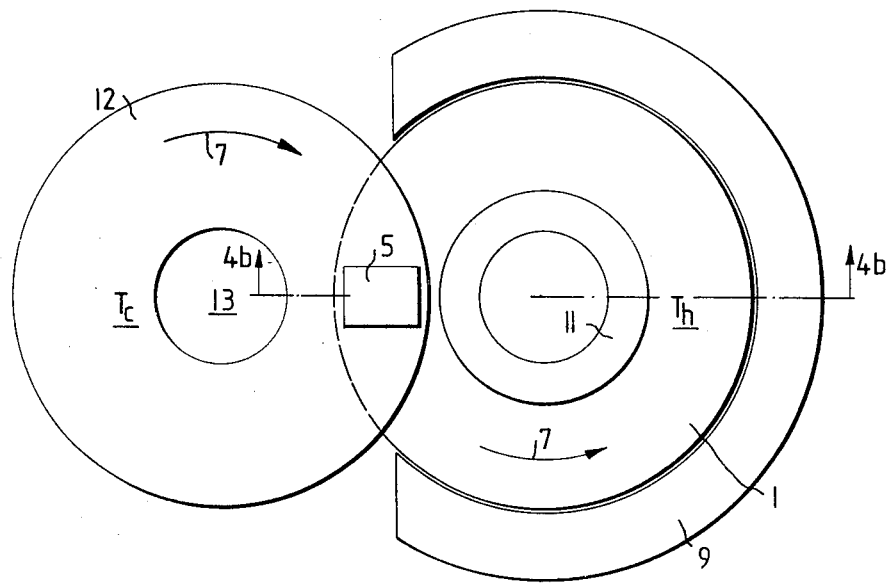
FIG. 4a and 4b show a thermoelectric arrangement in accordance with the invention as a generator in embodiment which is rotationally symmetrical.
Figure 4B:
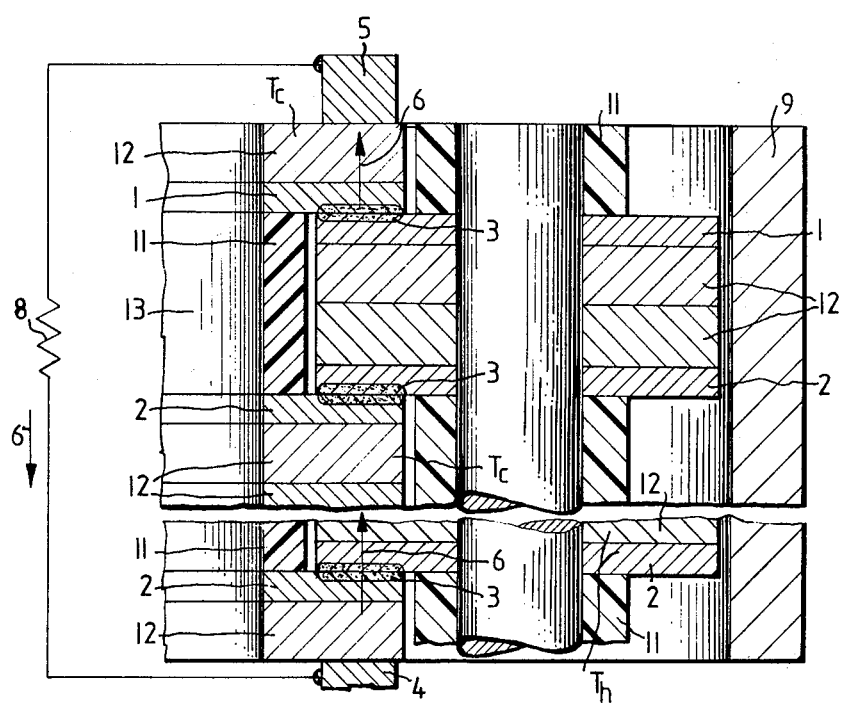

In FIG. 4b, 1 is a p+-silicon layer of $1.10^{-3}$ cm thickness which is applied to the face of a circular disc made of molybdenum plate 12. The thickness of the molybdenum plate 12 is 0.3 mm, the outer diameter of the circular disc is 60 cm. 2 is an n+-silicon layer of $1.10^{-3}$ cm thickness which is applied to the surface of a circular disc made of molybdenum sheet 12. The thickness of the molybdenum plates 12 is 0.3 mm, the outside diameter of the circular discs is 60 cm. In each case, two molybdenum discs 12 having a p+-silicon layer 1 and an n+-silicon layer 2 respectively are placed together in pairs with their uncoated sides. These pairs are mounted and stacked alternately around a water cooling device 13 shown in FIG. 4a which is constructed as a rotary axle and in a kiln 9 shown in FIGS. 4a and 4b which also contains axis of rotation so that they are interleaved to form a bundle at one point. 11 are insulating rings between the pairs. All of the circular discs made of molybdeum plate 12 having the layers 1 and 2 rotate at a peripheral speed indicated by the arrows 7, of 30 cm/sec. The circular discs 12, which are located in the furnace 9 have a temperature $T_h = 1300°$ K. The circular discs 12 around the water cooling device 13 are fixed at a temperature $T_c = 300°$ K. The hot and cold pairs of molybdenum disc 12 having the layers 1 and 2 overlap so that a hot and a cold layer 1 and a hot and a cold layer 2 are always sliding on each other in the non-stationary bundle. These sliding surfaces form regions 3 having the large temperature gradients. Electrical contacts 4 and 5 are constructed as rolling pressure contacts by means of which the non-stationary bundle is kept at a pressure of 100 kg. Electrical current 6 flows through a load 8 and between the electrical pressure contacts 4 and 5 through the non-stationary bundle which has a length of 125 cm.

In another variation of embodiment 4, the p+- and n+- silicon layers 1 and 2 are replaced by a $WSe_2$ layer 1 and a $Pr_2O_3$ layer 2. Both layers have a thickness of $\sim 10^{-5}$ cm and, as a result of continuous supply of very small quantities of $WSe_2$ or $Pr_2O_3$, are retained on the molybdenum plates 12 as an air-tight and cohesive film. The temperature difference $T_h - T_c = 1000°$ between the hot and the cold molybdenum plates 12 disappears almost completely in the $WSe_2$ layer 1 and the $Pr_2O_3$ layers 2 which, as a result and at the same time, are the zones 3 having the large temperature gradients. Since the thermal force between $WSe_2$ and $Pr_2O_3$ is greater than 1 mV/deg, this arrangement emits operating voltages greater than 1000 volts. Since with the materials $WSe_2$ and $Pr_2O_3$ it is a question of substances having a so-called "stratified lattice" (for example $MoS_2$, graphite, boron nitride, $WS_2$, $TiTe$, $La_2O_3$ etc.) the layers 1 and 2 simultaneously act as boundary surface lubricants. As a result the friction between the molybdenum sheets 12 which move almost in the same direction in the non-stationary bundle is reduced still further.

EMBODIMENT 5

In FIG. 5b, 1 is an iron plate with a thickness of 0.4 mm which has the shape of a circular ring having an outer diameter of 50 cm. 2 is a plate made of thermoconstanton (60% Cu+40% Ni) with a thickness of 0.3 mm which also has the shape of a circular ring having an outer diameter of 50 cm. 12 is a copper plate having a thickness of 0.3 mm which is coated with a $2.10^{-4}$ cm thick layer 14 of lead for the purpose of reducing the boundary surface friction and which also has an outer diameter of 50 cm. 11 are insulating rings. The copper rings 12 and the pairs of rings made from iron plate 1 and thermoconstantan plate 2 interleave so that a copper plate 12 lies between an iron plate 1 and a plate made of thermoconstantan 2 and so that a pair of plates made of iron 1 and thermoconstantan 2 always come to lie between two copper plates 12. The copper plates 12 in the form of rings rotate about a common axis as indicated at 7 and the iron plates 1 together with the plates made of thermoconstantan 2 also rotate about another common axis as also indicated at 7. In the overlapping region of the rotating rings 12 and the rotating rings 1 and 2, they are pressed together mechanically with the aid of the rolling electrical contacts 4 and 5 with a weight of 25 kg. If forms a non-stationary bundle by means of which the electrical current 6 is conducted with the aid of the current source 15. Heat is absorbed at the junction of the current 6 from the thermoconstantan 2 to the lead layer 14 on the copper 12 and at the junction of the current 6 from the lead layer 14 on the copper 12 to the iron 1.

The heat absorbed per unit time is proportional to the current intensity of 6 and to the Peltier voltage of the thermoconstantan 2 with regard to the lead 14 or of the lead 14 with regard to the iron 1. As a result of this heat absorption zones 3 having large temperature gradients arise at the broader interfaces which slide on one another. Heat becomes free reversibly at the junction of the current 6 from the iron 1 to the thermoconstantan 2, this heat being guided away via the water cooling device 13.

The iron plates 1 and the thermoconstantan plates 2 remain at the temperature $T_w = 300°$ K. and the copper plates 12 with the lead layer 14 are cooled off to the temperature $T_c$.

The rotating copper plates 12 - as shown in FIG. 5a form non-stationary bundles at four points as described in relation to FIG. 5b. The current 6 passes through these electrically in parallel. The frictional heat produced in the non-stationary bundle increase proportionally to the mechanical pressure P between the contacts 4 and 5. The sum of the electrical contact resistances in a non-stationary bundle increases on the other hand only by $P^{-\frac{1}{2}}$ (in metallically pure contact surfaces) or only by $P^{-\frac{2}{3}}$ (in contact surfaces having very thin external layers). With the aid of several parallel connected non-stationary bundles under a smaller pressure P respectively, a certain electrical resistance value combined with a fairly small frictional heat loss can be produced as compared with a single non-stationary bundle under the then necessarily much greater pressure P. The thickness of the non-stationary bundles is 1 meter. They contain 1000 thermoelements in series. The electrical overall resistance of the four parallel connected non-stationary bundles amounts to approximately $2.10^{-2}$ ohms. The electrical voltage of the battery 15 is 15.6 volts. The maximum cooling output of the arrangement (for $T_c = T_w$) is 6 kilowatts. With the aid of the heat insulation 16, very low temperatures $T_c$ can be achieved (with a cooling output approaching zero).

EMBODIMENT 6

Figure 6A:
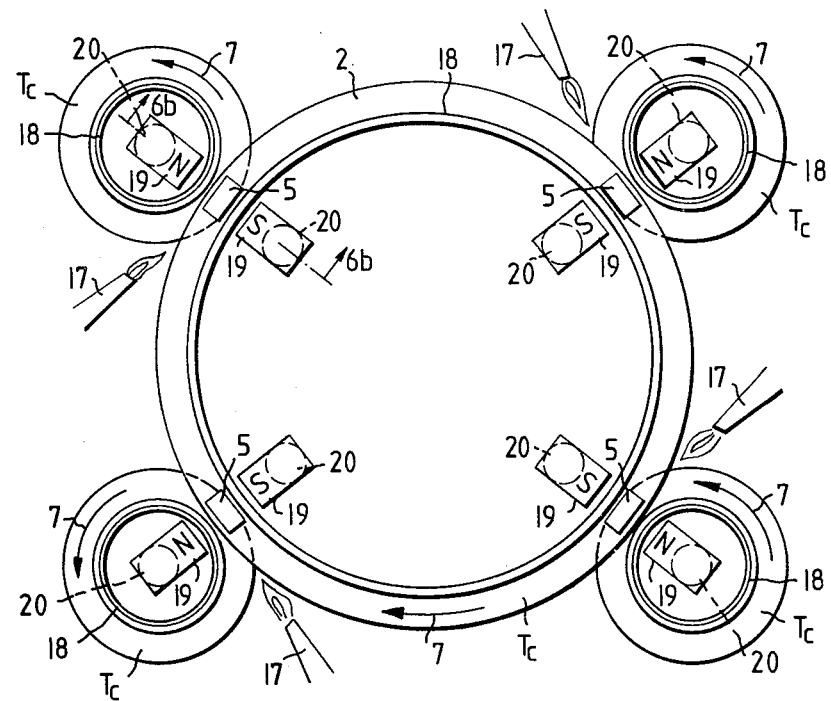
FIGS. 6a and 6b show a thermoelectric arrangement in accordance with the invention as a generator with electromotorized action.
Figure 6B:
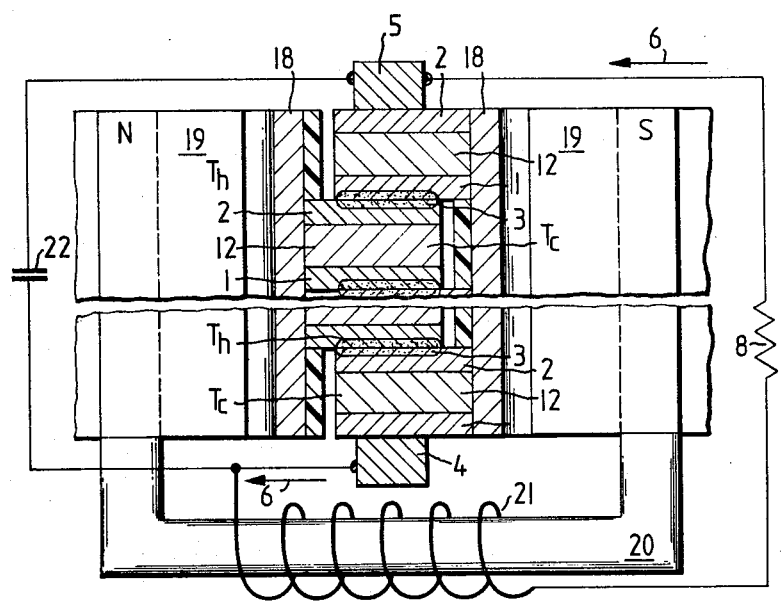

FIG. 6b shows a $1.10^{-3}$ cm thick layer made from the alloy "Pallaplat Plus" (95% Pt+5% Rh) and 2 is a $1.10^{-3}$ cm thick layer made from the alloy "Pallaplat Minus" (52% Au+46% Pd+2% Pt).

Both layers 1 and 2 are plated on to different sides of an iron plate 12 which has a thickness of 0.08 mm. The iron plates 12 having the plated layers 1 and 2 have the shape of relatively large and relatively small circular rings. As shown in FIG. 6a they are mounted concentrically about a ceramics tube 18 and are stacked with interposition of insulating rings 11. The iron plates 12, mounted about the relatively small ceramics tubes 18 (with layers 1 and 2), are interleaved with the iron plates 12 which are mounted about the relatively large ceramics tube 18 (the iron plates 12 with the layers 1 and 2) so that a layer 1 is always in contact with a layer 2. This interleaving between large and small iron plates 12 exists at four points where they form non-stationary bundles in accordance with FIG. 6b. The outer diameter of the large circular rings made of iron plates 12 about the large ceramics tube 18 is 2 meters, the outer diameter of the fairly small circular rings made of iron plate 12 about the fairly small ceramics tube 18 is 50 cm. All of the iron plates 12 rotate (as indicated at 7) at a peripheral speed of 50 cm/sec. The non-stationary bundles are loaded with a weight of 50 kg in each case by the electrical contacts 4 and 5. With the aid of four hydrogen-oxygen flames 17 which have the shape of a line the length of which is equal to the length of a non-stationary bundle, the plating layers 1 and 2 on the relatively large and on the relatively small iron plates 12 are heated up in each case shortly before their entry into a non-stationary bundle at the surface temperature $T_h = 1500°$ K. As a result, the zones 3 with large temperature gradients arise which in the non-stationary bundle are the hot contacts of the thermoelements connected electrically in series. By means of air cooling, the cold contacts are retained at the temperature $T_c = 500°$ K. The electrical currents 6 through the four non-stationary bundles are in parallel. They flow, before they are supplied to the load 8, through the exciter coils 21 of four electromagnets 20. Between their pole shoes 19 - having the north pole N and the south pole S - are located a non-stationary bundle through which current 6 flows in each case. As a result, a motor force is exercised on the rotating iron plates 12 in the direction 7 of their movement. The non-stationary bundles have a length of 2 meters. Each non-stationary bundle contains $2.10^4$ thermoelements in series connection and has an electrical resistance of 0.2 ohms. The idling voltage is 1200 volts. A capacitor 22 for smoothing the current 6 is connected between the electrical contacts 4 and 5 in parallel with each non-stationary bundle.

EMBODIMENT 7

Figure 7A:
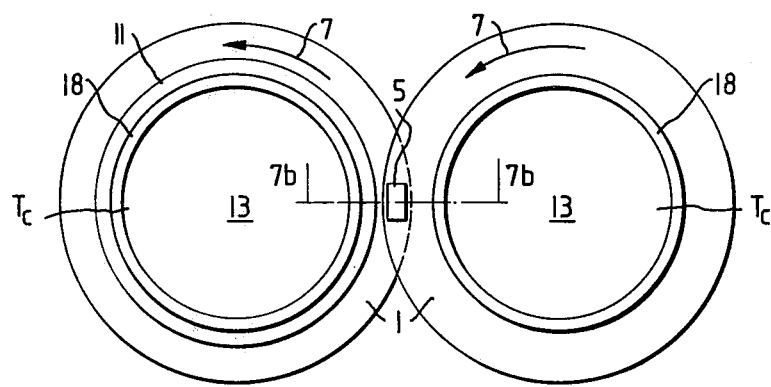
FIGS. 7a and 7b show a thermoelectric arrangement in accordance with the invention as a generator for converting friction heat.
Figure 7B:
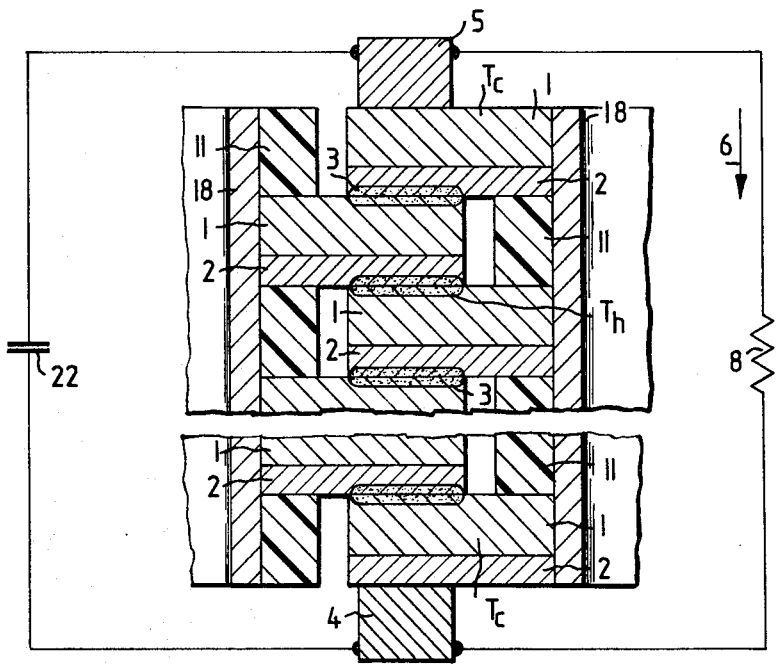

A tungsten plate having a thickness of 0.8 mm is shown at 1 in FIG. 7b. A tungsten carbide layer 2 with a thickness of 0.2 mm is applied to the tungsten plate 1. Each tungsten plate 1 with the tungsten carbide layer 2 has the shape of a circular ring with an outer diameter of 40 cm. Around two ceramics tubes 18 which have a water cooling device 13, are mounted the circular rings made from tungsten plate 1 having the tungsten carbide layer 2 and are stacked by using insulating rings 11 so that they interleave at one point (FIG. 7a). During this inter-leaving, a tungsten plate 1 always comes into contact with a tungsten carbide layer 2. The tungsten plates 1 with the tungsten carbide layers 2 rotate around the left-hand ceramics tube 18 and around the right-hand ceramics tube 18 in FIG. 7a with the same peripheral speed of 120 cm/sec. They move in a non-stationary bundle between the electrical contacts 4 and 5, but in the opposite directions. The pressure between the contacts 4 and 5 on to the non-stationary bundle having a length of 80 cm is 50 kg. Although the tungsten carbide layers 2 with their hexagonal structure have a relatively small coefficient of friction in the non-stationary bundle, a mechanical power equivalent of 100 kilowatts is converted into frictional heat. Zones 3 with large temperature gradients arise at the friction surfaces between the tungsten plates 1 and the tungsten carbide layers 2 owing to the friction at temperature peaks of up to 2000° C. In order to avoid oxidation, the arrangement is located in a helium atmosphere. In the non-stationary bundle between the contacts 4 and 5,800 thermoelements are connected in series. The hot contact positions of the thermoelements are the surfaces of tungsten 1 and tungsten carbide 2 which rub against each other. The cold points of contact of the thermoelements are the junction inside a tungsten plate 1 towards the tungsten carbide 2. Up to 85% of the mechanical energy required in order to overcome friction can be supplied to the load 8, via the electrical current 6, in the form of electrical energy. In order to smooth the current 6 the capacitor 22 is connected between the contacts 4 and 5.

It will be understood that the above description of the present invention is susceptible to various modification changes and adaptations.

What is claimed is:

1. A thermoelectric arrangement comprising a thermoelement having limbs formed from plates, movement means for moving said plates relative to each other with said plates being in touch contact at at least one point to form a bundle of alternate p/n and n/p thermoelectrical junctions and means enabling flows of electrical current through said bundle perpendicular to the main surfaces of said plates.

2. A thermoelectric arrangement as defined in claim 1, and comprising means for mechanically compressing said bundle.

3. A thermoelectric arrangement as defined in claim 1 and comprising means for unilaterally heating said plates by plasma or radiation and means for subsequently bringing together the hot sides and the cold sides of said plates.

4. A thermoelectric arrangement as defined in claim 1, and comprising means for bringing together alternately hot and cold pairs made from said plates.

5. A thermoelectric arrangement as defined in claim 4, said movement means comprises magnetic deflection means through which current flows.

6. A thermoelectric arrangement as defined in claim 1, and comprising a supply of heat for enabling the arrangement to act as an electrical generator.

7. A thermoelectric arrangement as defined in claim 1, and comprising electrical current supply means for causing the temperature differences in the non-stationary bundle so that the arrangement can operate as a heat pump.

8. A thermoelectric arrangement as defined in claim 1, wherein the temperature differences in said bundle are produced by means of mechanical friction between the thermoelectrically n-conductive and thermoelectrically p-conductive plates; and the friction heat is converted into electrical energy.

9. A thermoelectric arrangement as defined in claim 1, and comprising a capacitor connected electrically in parallel to said bundle.

10. A thermoelectric arrangement as defined in claim 1, and comprising several of said bundles connected electrically in parallel.

11. A thermoelectric arrangement as defined in claim 1, wherein said element limbs comprises a material selected from the group consisting of metals, metal alloys and metallic conductive compounds.

12. A thermoelectric arrangement as defined in claim 1, wherein said element limbs comprise metallically conductive plates coated on one or both sides with layers of thermoelectrically n-conductive or p-conductive material.

13. A thermoelectric arrangement as defined in claim 1, and comprising a thin film of interfacial lubricant coated on said plates in said bundle where they slide on each other to reduce friction and wear.

14. A thermoelectric arrangement as defined in claim 1, and comprising two different interfacial lubricants in the form of thin films for adjacent surfaces sliding on each other in said bundle with thin films having a high thermal force with respect to each other.

15. A thermoelectric arrangement as defined in claim 1 wherein said limbs are in the shape of strips formed from said plates.

16. A thermoelectric arrangement as defined in claim 1 wherein said limbs are in the shape of rings formed from said plates.

* * * * *